US006864696B2

(12) United States Patent
Logelin et al.

(10) Patent No.: US 6,864,696 B2
(45) Date of Patent: Mar. 8, 2005

(54) HIGH DENSITY, HIGH FREQUENCY, BOARD EDGE PROBE

(75) Inventors: Donald M. Logelin, Colorado Springs, CO (US); Bob J. Self, Colorado Springs, CO (US); Robert H. Wardwell, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/285,223

(22) Filed: Oct. 31, 2002

(65) Prior Publication Data

US 2004/0085081 A1 May 6, 2004

(51) Int. Cl.[7] .............................................. G01R 31/28
(52) U.S. Cl. ...................................................... 324/754
(58) Field of Search .................................. 324/754, 761, 324/762, 755, 158.1, 73.1; 439/482, 62–72

(56) References Cited

U.S. PATENT DOCUMENTS

| 4,340,858 A | * | 7/1982 | Malloy ........................ 324/761 |
| 4,724,377 A | * | 2/1988 | Maelzer et al. ............. 324/149 |

* cited by examiner

Primary Examiner—Vinh P. Nguyen

(57) ABSTRACT

A probe that connects test and measurement equipment to a device under test via a plurality of cables. The probe is formed of a plurality of printed circuit boards that are stacked together. Each board is connected to one of the plurality of cables and has a longitudinal set of pads along an edge electrically connected to the cable. The stacked plurality of printed circuit boards form a two dimensional array of pads for connecting to a similar set of pads on a device under test.

23 Claims, 5 Drawing Sheets

HIGH DENSITY, HIGH FREQUENCY, BOARD EDGE PROBE

BACKGROUND OF THE INVENTION

Designers of test and measurement equipment face a variety of challenges in creating cables and connectors that form probes for interfacing with a device under test (DUT). Designers are always trying to fit an ever-increasing number of connections into a constantly decreasing area on the DUT for interfacing. At the same time, the signaling rate and frequency content of the signals being probed is also increasing. This presents several challenges to the designers of such probes.

For example, it has proven difficult to provide a highly compact array of connections that minimize the footprint and at the same time place probe tip networks, such as isolation circuits, extremely close to the pads of the grid array on the DUT. More specifically, manufacturers of devices being tested with such probes desire an array having a center-to-center distance of less than 1 millimeter. Further, when such probes are used to transfer high bandwidth (greater than 1 Ghz) signals, signal isolation and signal fidelity become a problem, especially when attempting to interface with a large number of signals (greater than 100) in a small area (less than 0.25 sq. in.). It has also proven quite difficult to minimize the capacitive loading of the probe, to less than 1 pF per signal, on a DUT with such a great number of connections. Finally, it is desirable that probes have a minimal electrical transmission line stub length between the probed pad and the isolation components minimizing the effects of the probe on the high-speed signals of the DUT.

The Inventors of the present invention have determined a need for a probe that increases the density of connections, while minimizing capacitance loading and stub length while maximizing usability of the probe.

BRIEF DESCRIPTION OF THE DRAWINGS

An understanding of the present invention can be gained from the following detailed description of the invention, taken in conjunction with the accompanying drawings of which.

DETAILED DESCRIPTION

Figure 1:
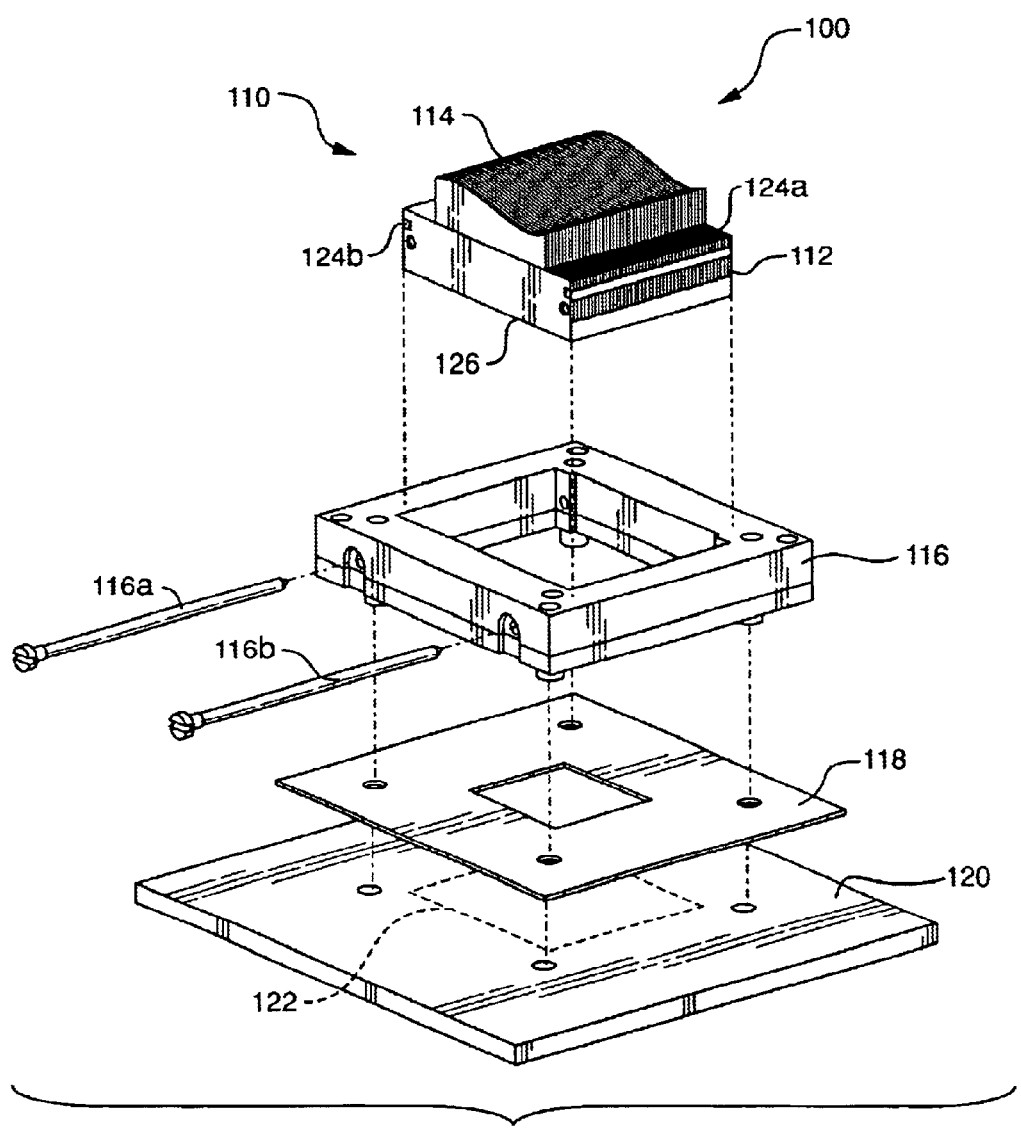
FIG. 1 is an orthogonal assembly view of a probe assembly for interfacing with a device under test in accordance with a preferred embodiment of the present invention.

Reference will now be made in detail to the present invention, examples of which are illustrated in the accompanying drawings, wherein like reference numerals refer to like elements throughout.

FIG. 1 is an orthogonal assembly view of a probe assembly 100 for interfacing with a device under test 120 ("DUT 120") in accordance with a preferred embodiment of the present invention. It will be appreciated by those of ordinary skill in the relevant arts that the probe assembly 100, as illustrated in FIG. 1, is generally representative of such assemblies and that any particular probe assembly may differ significantly from that shown in FIG. 1, particularly in the details of construction. As such, the probe assembly 100 is to be regarded as illustrative and exemplary and not limiting as regards the invention described herein or the claims attached hereto.

The probe assembly 100 basically comprises a probe 110, a clamp block 114 and an elastomeric connector 118. The probe 110 generally comprises a board stack 112, comprising a plurality of stacked board assemblies (described hereinafter), connected to a plurality of cables 114. The board stack 112 forms a planer array of conductive pads suitable for interfacing with an array 122 on the DUT 120. Signals output by the DUT 120 are transmitted to the cables 114 by the board stack 112. The cables 114 preferably comprise coaxial ribbon cables, including, for example, ribbonized coxial cables. A clamp block 116 serves to secure and align the board stack 112, via screws 116a and 116b, and provide the force necessary to bring the planer array of pads into finn contact with the array 122 on the DUT 120 via the elastomneric connector 118.

The elastomeric connector 118 preferably comprises a conductive compliant membrane that facilitates contact between the planer array of pads on the end of the board stack 112 and the array 122 on the DUT 120. The elastomeric connector 118 can comprise, for example a LGA connector like those provided by TYCO (rubber conductive bumps in a carrier), High Connection Density Inc. (rubber with coil springs in a carrier), Intercon Systems cLGA (BECU "c" shaped springs in carrier), Teledyne Interconnect Devices (BECU springs molded in a carrier) or the Agilent Technologies Bumplett Connector described in co-pending U.S. patent application Ser. No. 10/232,800 filed Aug. 30, 2002 assigned to the assignee of the present invention. Preferably, the elastomeric connector 118 provides an array of compliant contacts on 1 mm pitch in a configuration matching the array 120. Also preferably, the elastomeric connector 118 is provided with alignment pins or holes that assure proper alignment. The compliant portions, i.e. springs, provide the necessary compliance to allow deviations in the contact surface. Each example listed above is different and some have advantages over the others. Selection of an appropriate solution for the elastomeric connector 118 is left to those of ordinary skill in the art.

Figure 2:
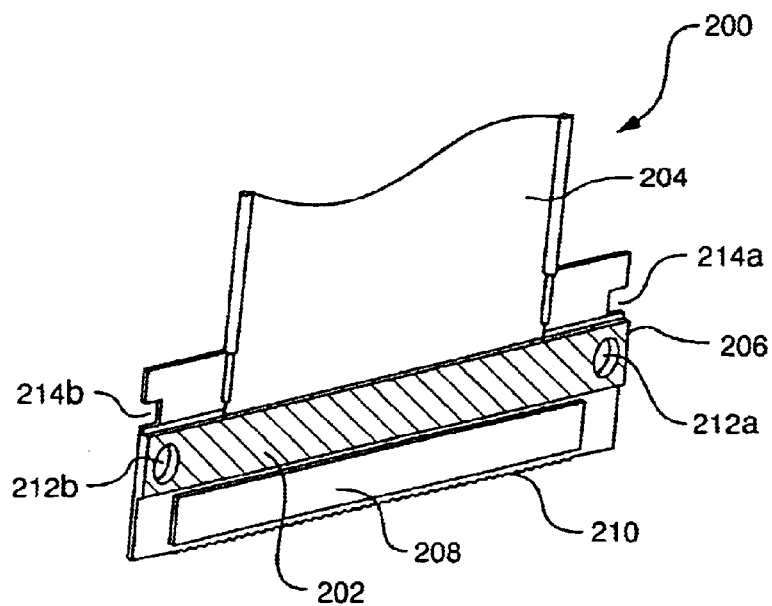
FIG. 2 is an orthogonal view of an individual board assembly in accordance with a preferred embodiment of the present invention.

FIG. 2 is a perspective view of an individual board assembly 200 in accordance with a preferred embodiment of the present invention. The board assembly 200 generally comprises a board 202, having a stepped construction that provides several "steps" of different thickness. The board 202 supports a coaxial cable 204 on a far edge (the edge away from the DUT) of the board 202. The conductors on the coaxial cable 204 are connected to pads that are formed on another step that compensates for the thickness of the insulation material of the cable 204. A ground plane 206 forms a further step, the highest level. The ground plane 206 creates a stripline environment that improves signal isolation. The ground plane 206 and another internal board ground plane (see FIG. 4) provide isolation between signals on adjacent boards 202. The additional thickness of the ground pane 206 provides mechanical strength and prevents adjacent boards (not shown) from shorting should they bend.

Alignment holes 212a and 212b may be provided through the thickest portion of the board 202 to aid in aligning the plurality of boards 202n used to form the probe. The board 202 is then stepped down to accommodate the thickness of components of a probe tip network 208, such as an isolation network. A series of pads 210 are formed along the near edge of the board 202. Additional alignment slots 214a and 214b may be formed in each board 202 to facilitate alignment prior to insertion of the probe assembly 200 in the clamp 114 (see FIG. 1).

In accordance with perhaps the preferred embodiment, the probe tip network 208 is formed of components, such as RCR's, that serve as an isolation circuit. The RCRs may be attached by soldering discrete resistors and capacitors to the board 202. Alternatively, the components can be printed on a substrate, such as ceramic. The substrate may be soldered or glued into place. The probe tip components may also be formed by any number of other structures, such as integrated circuits, or even embedded into the printed circuit board. Two possible configuration are presented in detail in FIGS. 6a and 6b.

Electrically, the probe tip network 208 is interposed between the cable 204 and the series of pads 210 on the near edge of the board 202. The selection of components and the formation of networks thereof is beyond the scope of the present description. It is suffice to say that those of ordinary skill in the art of probe development understand the creation of probe tip networks.

One benefit provided by the present invention is that the stepped nature of the board 202 permits multiple boards 202 to be placed adjacent to one another with a pitch of less than 1 millimeter. Also the fact that the isolation components are in a plane that is orthoganal to the DUT pads 122 being probed allows the component pitch along the board 202 to be less than 1 millimeter. Because the probe pads 210 are formed on the edge of the board allowing the these pads 210 to be connected to the isolation components 208 without layer to layer vias minimizes the electrical stub length and capacitive load on the DUT signals.

The series of pads 210 may be formed on the edge of the board 202 using any of a variety of techniques. For example, vias can be formed in proximity to the near edge. The board 202 is then be cut through the middle of the vias, leaving one half of the via exposed as a contact (castilated I/O) thereby forming a new near edge. Alternatively, small metal components can be mounted over the edge of the board 202 with the entire assembly being lapped to ensure planarity. By way of yet another example, wrap around printed circuit planes could be created, with a pre-mask or post-route operation used to form individual pads. In accordance with the preferred embodiment, there are 49 pads per board. The pads are preferably 0.25 mm wide with 1 mm between centers.

Figure 3:
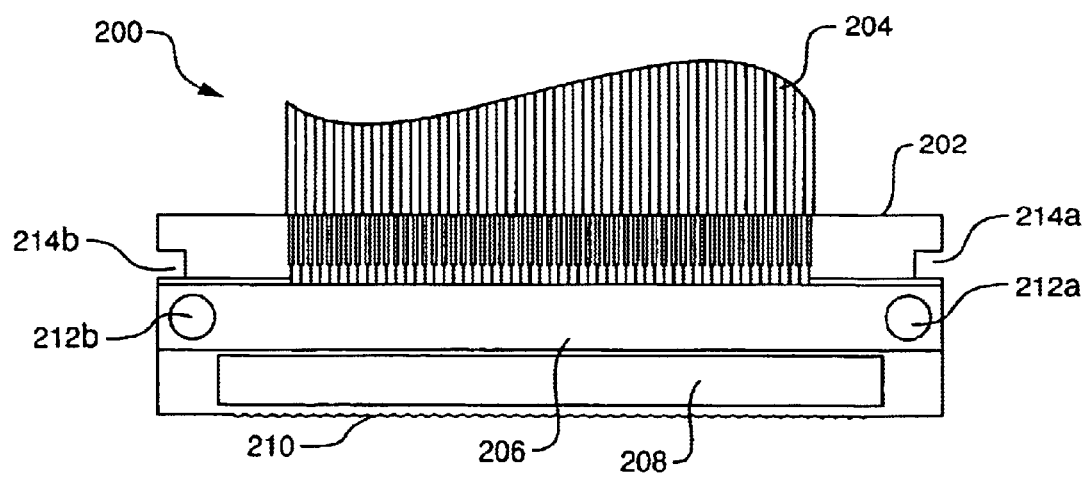
FIG. 3 is a plan view of a board assembly in accordance with a preferred embodiment of the present invention.

FIG. 3 is a plan view of a board assembly 200 in accordance with a preferred embodiment of the present invention. The board 202 is preferably formed of FR-4, but other material may be used and still fall within the scope of the present invention. The board 202 is, in one preferred embodiment, 2.315 inches long, and 0.60 inches wide. The ground plane 206 is preferably 0.195 inches wide, while the lower portion, which receives the network component 208 is preferably 0.205 inches wide. Holes 212a and 212b are preferably 0.126 inches in diameter, 2.120 inches apart center to center and spaced 0.303 from the pads 210.

Figure 4:
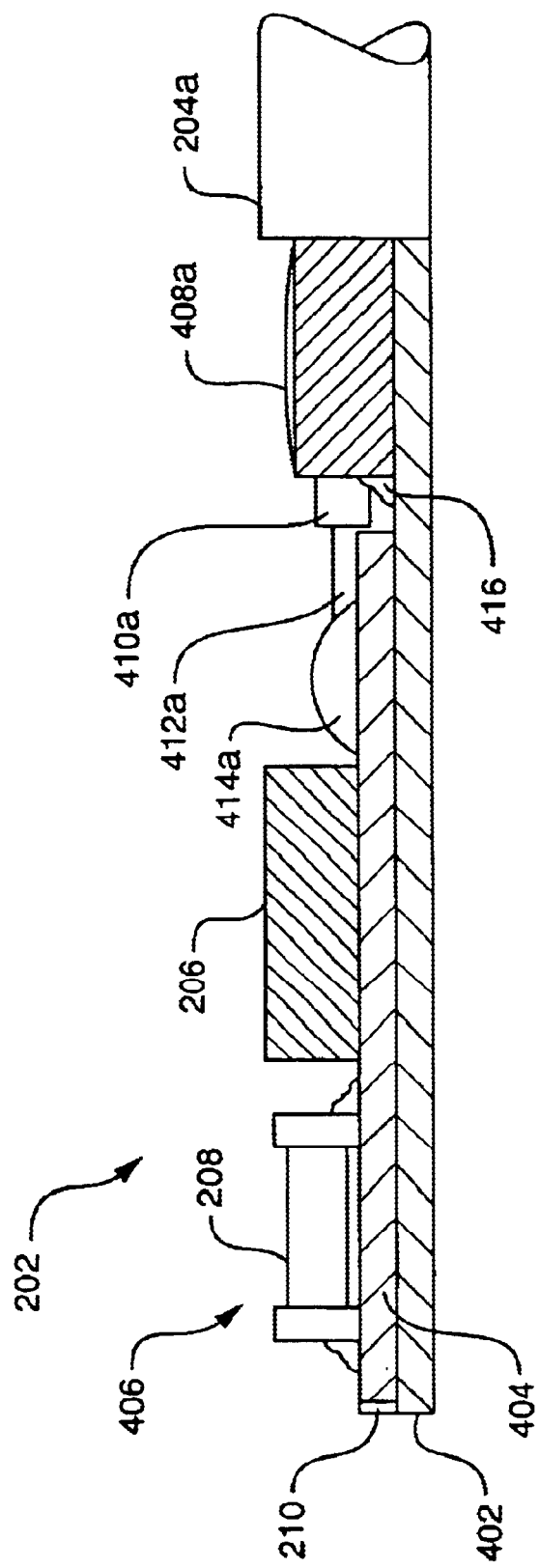
FIG. 4 is a side view of a board in accordance with a preferred embodiment of the present invention.

FIG. 4 is a side view of a board in accordance with a preferred embodiment of the present invention. In this view, while only one coaxial cable 204a of the ribbon cable 204 is portrayed, those of ordinary skill in the art will recognize that each coaxial cable 204n of the ribbon cable 204 is attached in a similar manner as described. The board 202 is formed of three layers: a base layer 402, a signal layer 404 and a component layer 406. The base layer is preferably 0.010 inches thick and supports the remaining layers.

The internal ground plane 416 is preferably formed on top of the base layer 402. The shield braids 408 of the coaxial cable 204a are soldered to the ground plane 416. The signal layer 404 is formed on top of the base layer 402 (and hence the ground plane 416) and is also preferably 0.010 inches thick (0.020 inches thick total). An inner insulation layer 410 of the coaxial cable 204 abuts the signal layer 404, while a center conductor 412 of the coaxial cable 204 lays on top of the signal layer 402. Each center conductor 412 of the coaxial cable 204 is preferably soldered to the signal layer 402 with a solder joint 414. The component layer 406 comprises the ground plane 206 and the probe tip network 208. Preferably, the ground plane 206 is 0.015 inches thick (0.035 inches thick total) while the components of the probe tip network 208 are preferably less than 0.015 inches thick. The maximum thickness of the board 202 is preferably 0.035 inches thick (1 mm) which, when all the boards 202 are laminated together, provides a 1 mm pitch. Those of ordinary skill in the art will recognize that the overall thickness of the board 202 may be thicker or thinner depending on the thickness of the layers and the ground plane 206 in particular. In general, the thickness of the board 202 will depend on the clock speeds of the DUT and materials used.

Referring back to FIG. 1, each board 202 is ganged together to form the board stack 112. The number of boards required will depend on the array size on the DUT. For an array of 49×49, 49 boards 202 are required. For an array 41×41, 41 boards 202 will be needed. The board stack 112 may be aligned using bars 124a and 124b milled to fit the slots 214a and 214b. Additionally, backer plates 126 (only one shown) may be provided to assist with assembly. Once the boards have been ganged together, they may be lapped flat to ensure planarity of the array of pads. Alignment is maintained within the clamp 114 by the screws 116a and 116b. Once assembled, the probe 100 is ready to be attached to the device under test 120.

Figure 5:
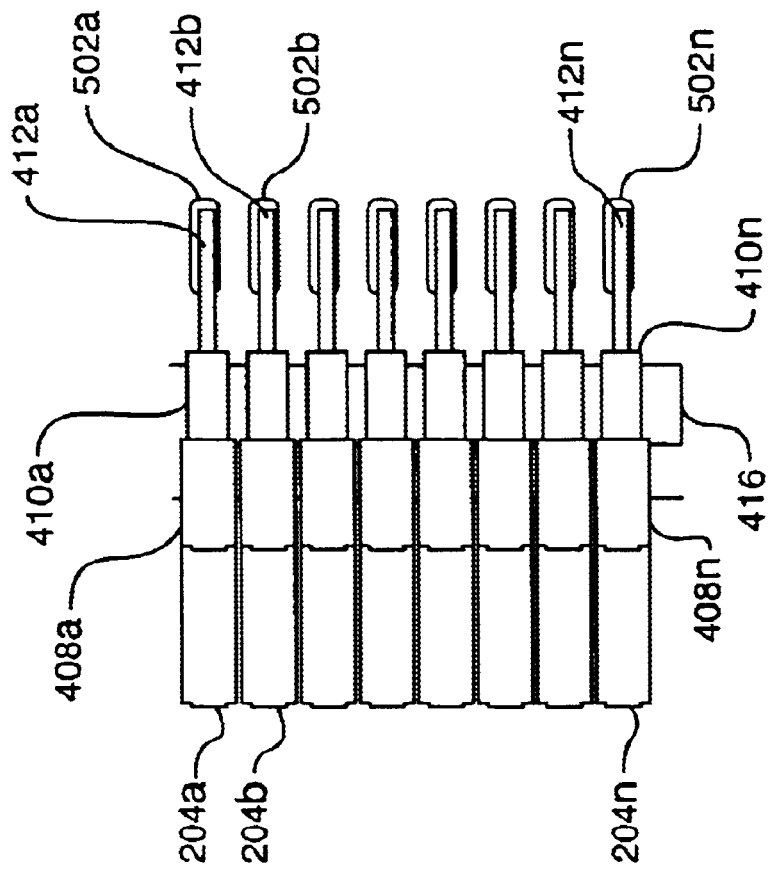
FIG. 5 is a partial plan view of the connection between a ribbon cable and a board assembly in accordance with a preferred embodiment of the present invention.

FIG. 5 is a partial plan view of the connection between a ribbon cable 204 and a board assembly 202 in accordance with a preferred embodiment of the present invention. As illustrated each center conductor 412n of the ribbon cable 204 is soldered to a pad 502n on the signal layer 404.

Figure 6A:
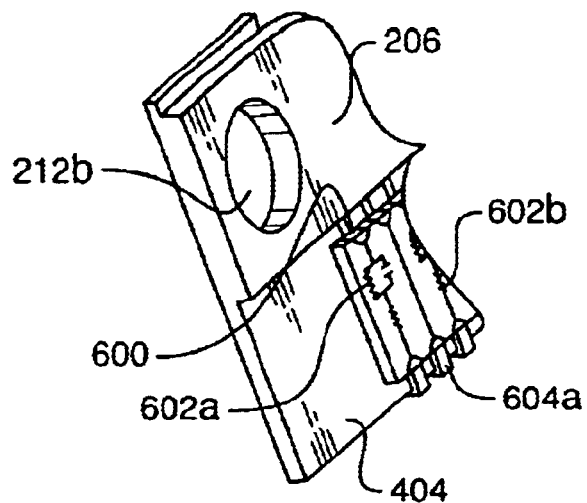
FIGS. 6a and 6b are orthogonal partial views of a board assembly in accordance with preferred embodiments of the present invention.
Figure 6B:
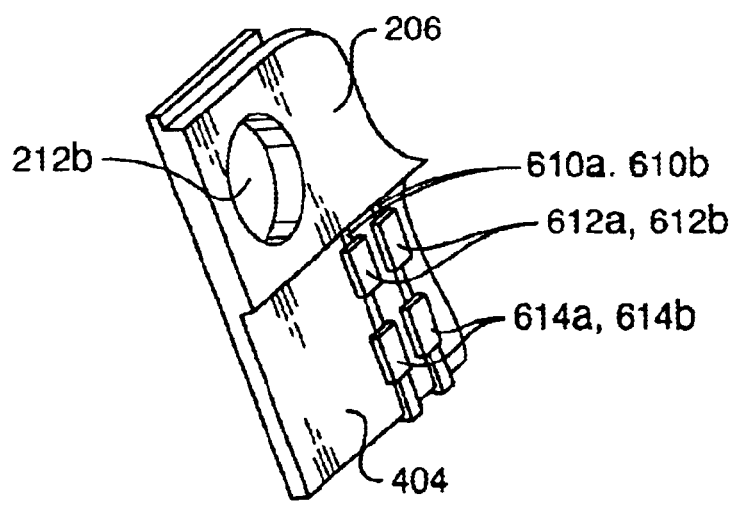

FIGS. 6a and 6b are orthogonal partial views of probe boards 202 in accordance with preferred embodiments of the present invention. FIG. 6a shows the use of etched ceramic blocks 600. The ceramic block 600 is soldered to the signal layer 404. The ceramic block 600 is etched, using known techniques, with circuits, including RCR circuit 602n and short circuits 604n. RCR circuits 602a and 602b are shown along with short circuit 604a. The makeup of the circuits etched on the ceramic block 600 are beyond the scope of the present invention, but are well within the skill of those of ordinary skill in the art to design and implement.

FIG. 6b shows the use of discrete components 610n, 612n, and 614n, instead of an etched ceramic block 600 as shown in FIG. 6a. In this embodiment, capacitors 612a and 612b are stacked on resistors 610a and 610b respectively. Each stack is connected to a resistor 612n. Such discrete RCR components can be mounted on the signal layer 404 in a convention manner. As above, the makeup of the circuits formed using such discrete components is beyond the scope of the present invention, but are well within the skill of those of ordinary skill in the art to design and implement.

Although couple embodiments of the present invention have been shown and described, it will be appreciated by those skilled in the art that changes may be made in these embodiments without departing from the principles and spirit of the invention, the scope of which is defined in the claims and their equivalents.

By stepping the board thickness for the coaxial cables 204 and the components 208, the boards 202 can be placed adjacent to one another on a pitch of 1 mm or less. Placing the boards 202 orthogonal to the DUT 120 permits the placement of components 208 on a pitch 1 mm or less. This allows the density of components 208 to match DUT arrays 122 having a pitch of 1 mm and less. Having the contacts 210 on the edge of the board 202 allows the signal to contact the probe point without layer-to-layer vias and allows the placement of the components 208 very close to the DUT 120 contact point. This minimizes the capacitive load and electrical stub length that the signals on the DUT 120 as a result of connecting the probe 110, minimizing the electrical effects of connecting the probe 110. The ground planes 206 and 416 in the boards 202 are co-planer with the propagation of the probed signals, providing a controlled impedance environment and help isolate the signals on the individual probe boards 202 as well as isolate signals between adjacent probe boards 202. This results in a high bandwidth connection between the DUT 120 and the test/measurement equipment.

What is claimed is:

1. A probe comprising:
   a plurality of boards each board having a first interface for attaching a cable and a second interface having a row of conductive pads for connecting to a device under test;
   a plurality of cables, each cable being attached to a first interface of one of the plurality of boards; and
   a clamp aligning the plurality of boards in a stack forming a two dimensioned grid of conductive pads.

2. The probe, as set forth in claim 1, wherein each of the boards further comprises:
   a probe tip network supported by the board between the first interface and the second interface.

3. The probe, as set forth in claim 2, wherein the network is an isolation network.

4. The probe, as set forth in claim 3, wherein the probe tip network is formed on a ceramic block.

5. The probe, as set forth in claim 3, wherein the probe tip network comprises discrete components.

6. The probe, as set forth in claim 3, wherein the probe tip network comprises an integrated circuit.

7. The probe, as set forth in claim 1, wherein each of the plurality of boards has a stepped construction.

8. The probe, as set forth in claim 1, wherein the plurality of cables comprise a plurality of co-axial ribbon cables.

9. The probe, as set forth in claim 1, wherein each of the plurality of boards comprises:
   a first layer, extending the length of the body, having a height selected for receiving the cable and having the first interface formed thereon;
   a second layer secured to the first layer, the second layer having a height selected to support a conductor of the cable; and
   a third layer bonded to the second layer, the third layer including an external ground plane and a probe tip network.

10. The probe, as set forth in claim 9, wherein each of the plurality of boards further comprises:
    an internal ground plane bonded to the first layer extending between the second layer and the first layer.

11. The probe, as set forth in claim 9, wherein the network on each of the plurality of boards comprises:
    a probe tip network attached to the second layer that inserts an isolation circuit between the first interface and the second interface, wherein the height of the probe tip network is less than the height of the external ground plane.

12. The probe, as set forth in claim 9, wherein the second layer of each board is provided with a hole that interfaces with the clamp to facilitate alignment.

13. The probe, as set forth in claim 9, wherein the overall height of each board is 0.035 inches or less.

14. A probe comprising: a plurality of cables; and
    a plurality of printed circuit boards stacked together, a first edge of each board electrically connected to one of the plurality of cables and having a longitudinal set of pads along a second edge electrically connected to the cable, whereby the plurality of printed circuit boards form a two dimensional array of pads for connecting to a device under test.

15. The probe, as set forth in claim 14, wherein each board further comprises:
    an isolation circuit attached to the board between the cable and the longitudinal set of pads.

16. The probe, as set forth in claim 15, wherein the isolation circuit comprises at least one of a ceramic block, discrete components, and an integrated circuit.

17. The probe, as set forth in claim 14, wherein each of the plurality of boards has a stepped construction.

18. The probe, as set forth in claim 14, wherein the plurality of cables comprise a plurality of co-axial ribbon cables.

19. The probe, as set forth in claim 18, wherein each board is 0.035 inches thick or less.

20. The probe, as set forth in claim 14, wherein each of the plurality of boards is formed of an elongated body comprising:
    a first layer, extending the length of the body, having a height selected for receiving the cable and having the first interface formed thereon;
    a second layer secured to the first layer, the second layer having a height selected to support a conductor of the cable; and
    a third layer bonded to the second layer, the third layer including an external ground plane and a probe tip network.

21. The probe, as set forth in claim 20, wherein each of the plurality of boards further comprises:
    a probe tip network attached to the second layer that inserts an isolation circuit between the cable and the longitudinal set of pads, wherein the height or the probe tip network is less than the height of the ground plane.

22. The probe, as set forth in claim 20, wherein each board is provided with a hole to facilitate alignment of the stack.

23. A method of forming a probe comprising:
    fabricating a plurality of printed circuit boards using a stepped construction, each of the plurality of printed circuit boards having a longitudinal set of pads along an edge;
    attaching a cable to each of the plurality of printed circuit boards; and
    stacking the plurality of printed circuit boards so as to align the longitudinal pads of each board to form a two dimensional array of pads.

* * * * *